United States Patent
Lee

(10) Patent No.: US 9,922,697 B2
(45) Date of Patent: Mar. 20, 2018

(54) MEMORY DEVICE

(71) Applicant: SK hynix Inc., Gyeonggi-do (KR)

(72) Inventor: Byeong-Cheol Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/789,597

(22) Filed: Oct. 20, 2017

(65) Prior Publication Data

US 2018/0040364 A1    Feb. 8, 2018

Related U.S. Application Data

(62) Division of application No. 15/350,233, filed on Nov. 14, 2016, now Pat. No. 9,824,746.

(30) Foreign Application Priority Data

Jun. 29, 2016  (KR) .................. 10-2016-0081499

(51) Int. Cl.
| | | |
|---|---|---|
| G11C 7/00 | (2006.01) |
| G11C 11/4094 | (2006.01) |
| G11C 11/4091 | (2006.01) |
| G11C 11/406 | (2006.01) |

(52) U.S. Cl.
CPC ........ *G11C 11/4094* (2013.01); *G11C 11/406* (2013.01); *G11C 11/4091* (2013.01)

(58) Field of Classification Search
CPC ..... G11C 7/00; G11C 11/4094; G11C 11/406; G11C 11/4091

USPC ........................ 365/189.011–225.7
See application file for complete search history.

(56) References Cited

U.S. PATENT DOCUMENTS

| | | | | | |
|---|---|---|---|---|---|
| 5,406,526 | A | * | 4/1995 | Sugibayashi | ......... G11C 11/408 365/230.03 |
| 5,631,872 | A | * | 5/1997 | Naritake | ............... G11C 11/406 365/203 |
| 6,259,642 | B1 | * | 7/2001 | Hwang | ..................... G11C 7/18 365/206 |
| 2002/0054530 | A1 | * | 5/2002 | Chung | .................. G11C 11/406 365/222 |
| 2003/0214859 | A1 | * | 11/2003 | Jung | ................... G11C 11/4087 365/200 |

\* cited by examiner

*Primary Examiner* — Harry W Byrne
(74) *Attorney, Agent, or Firm* — IP & T Group LLP

(57) ABSTRACT

A memory device may include: a plurality of cell mats arranged in a plurality of rows and columns; a plurality of first drivers, each first driver being disposed on a left side of a corresponding cell mat of the plurality of cell mats and configured to drive a first sub-word line of the corresponding cell mat; and a plurality of second drivers, each second driver being disposed on a right side of the corresponding cell mat of the plurality of cell mats and configured to drive a second sub-word line of the corresponding cell mat, wherein, during an active operation, among the plurality of cell mats, sub-word lines of cell mats disposed in odd-numbered columns or sub-word lines of cell mats disposed in even-numbered columns are selectively activated.

8 Claims, 14 Drawing Sheets

MEMORY DEVICE

CROSS-REFERENCE TO RELATED APPLICATION

This application is a division of U.S. patent application Ser. No. 15/350,233 filed on Nov. 14, 2016, which claims priority under 35 U.S.C. § 119(a) to Korean Patent Application No. 10-2016-0081499 filed on Jun. 29, 2016 in the Korean Intellectual Property Office (KIPO). The disclosure of each of the foregoing application is incorporated herein by reference in its entirety.

TECHNICAL FIELD

Exemplary embodiments of the present inventive concept relate to a memory device including a plurality of drivers.

DISCUSSION OF THE RELATED ART

FIG. 1 is a diagram schematically illustrating the configuration of a cell array 100.

Referring to FIG. 1, the cell array 100 may include a plurality of main word lines WL0 to WLx (x is a natural number), a plurality of bit lines BL0 to BLy (y is a natural number), and a plurality of memory cells MC.

In the case where memory cells MC are accessed (read or written), a main word line corresponding to a row address may be activated in response to an active command, and data of a bit line corresponding to a column address may be accessed in response to a read command or a write command.

In FIG. 1, a range within which memory cells can be accessed when one main word line is activated is called a page. Considering circuits (not shown in FIG. 1) which are disposed in the cell array 100 to control the plurality of memory cells MC, as the size of the page is increased, the cell array 100 can be more efficiently configured, whereby it is advantageous in terms of size. However, if the size of the page is increased, there is a problem in that current consumption during an active operation increases due to reasons such as an increase in the number of memory cells to be coupled to the bit line when the main word line is activated.

SUMMARY

Various embodiments are directed to a memory device capable of substantially increasing the page size while keeping current consumption during an active operation the same or substantially reduced.

In an exemplary embodiment of the present inventive concept, a memory device may include: a plurality of cell mats arranged in a plurality of rows and columns; a plurality of first drivers, each first driver being disposed on a left side of a corresponding cell mat of the plurality of cell mats and configured to drive a first sub-word line of the corresponding cell mat; and a plurality of second drivers, each second driver being disposed on a right side of the corresponding cell mat of the plurality of cell mats and configured to drive a second sub-word line of the corresponding cell mat, wherein, during an active operation, among the plurality of cell mats, sub-word lines of cell mats disposed in odd-numbered columns or sub-word lines of cell mats disposed in even-numbered columns are selectively activated.

In an exemplary embodiment of the present inventive concept, a memory device may include: a plurality of cell areas each including a plurality of cell mats arranged in one column; one or more inner driver areas, which are disposed between the plurality of cell areas in an alternating manner, each of the one or more inner driver areas including a first plurality of drivers arranged in two columns; and first and second outer driver areas, which are disposed outside the plurality of cell areas, and each of which includes a second plurality of drivers arranged in one column, wherein each of the first and second plurality of drivers drives a sub-word line of a cell mat adjacent thereto, and, during an active operation, sub-word lines of cell mats disposed in odd-numbered cell areas or sub-word lines of cell mats disposed in even-numbered cell areas among the plurality of cell areas are selectively activated.

In an exemplary embodiment of the present inventive concept, a memory device may include: first to nth (n is a natural number) cell mats, which are arranged one by one, each cell mat including one or more first and second sub-word lines; first to nth left drivers, each being disposed on a left side of a corresponding cell mat of the first to nth cell mats and configured to drive the one or more first sub-word lines of the corresponding cell mat; and first to nth right drivers, each being disposed on a right side of a corresponding cell mat of the first to nth cell mats and configured to drive the one or more second sub-word lines of the corresponding cell mat, wherein a kth (k is a natural number satisfying 1≤k<n) right driver among the first to nth right drivers and a k+1th left driver among the first to nth left drivers are disposed together between a kth cell mat and a k+1th cell mat among the first to nth cell mats.

In an exemplary embodiment of the present inventive concept, a memory device may include: first to fourth drivers; a first cell mat including a first sub-word line coupled to the first driver and a second sub-word line coupled to the second driver; and a second cell mat including a third sub-word line coupled to the third driver and a fourth sub-word line coupled to the fourth driver, wherein the first cell mat is disposed between the first driver and the second driver, the second cell mat is disposed between the third driver and the fourth driver, both the second driver and the third driver are disposed between the first cell mat and the second cell mat, and wherein the second sub-word line is not connected to the third driver, and the third sub-word line is not connected to the second driver.

During an active operation, the first to fourth sub-word lines may be selectively activated.

DETAILED DESCRIPTION

Figure 1:
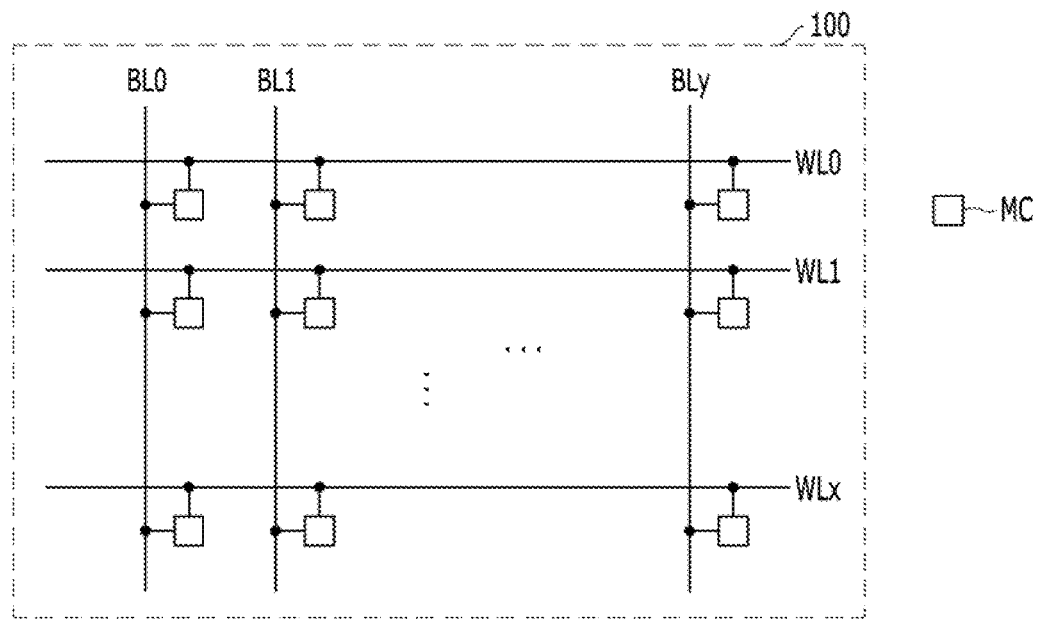
FIG. 1 is a diagram schematically illustrating the configuration of a cell array.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Figure 2:
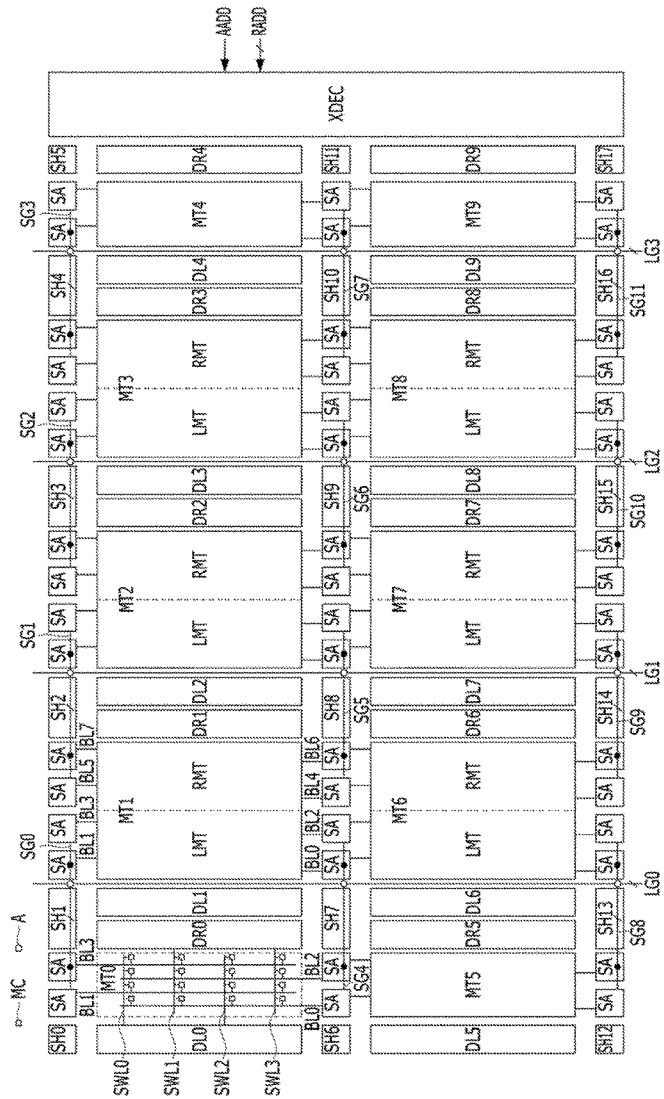
FIG. 2 is a configuration diagram of a memory device in accordance with an embodiment of the present invention.
Figure 3:
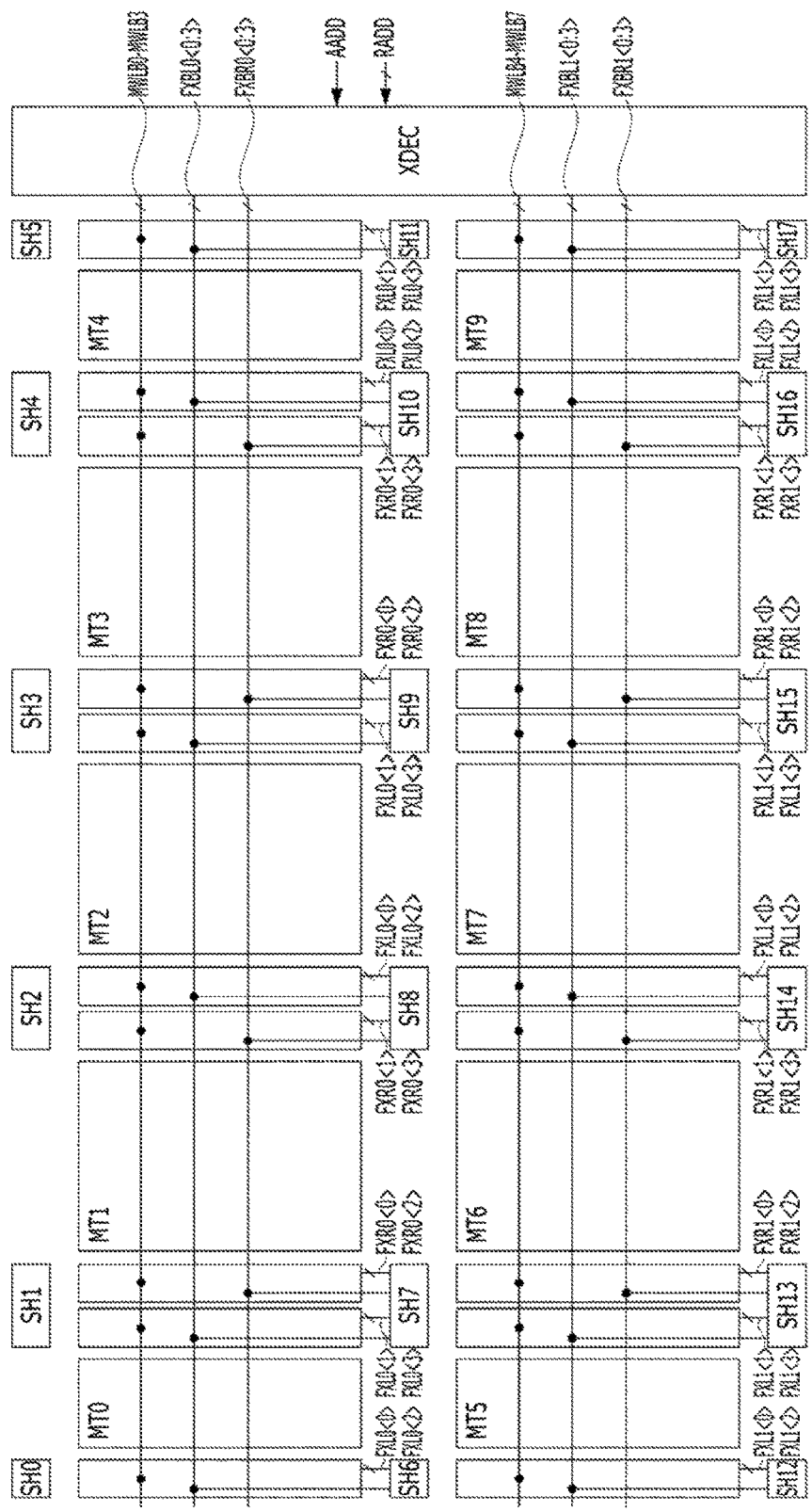
FIG. 3 is a diagram illustrating signals which are used to control sub-word lines among signals which are used in the memory device of FIG. 2.
Figure 4A:
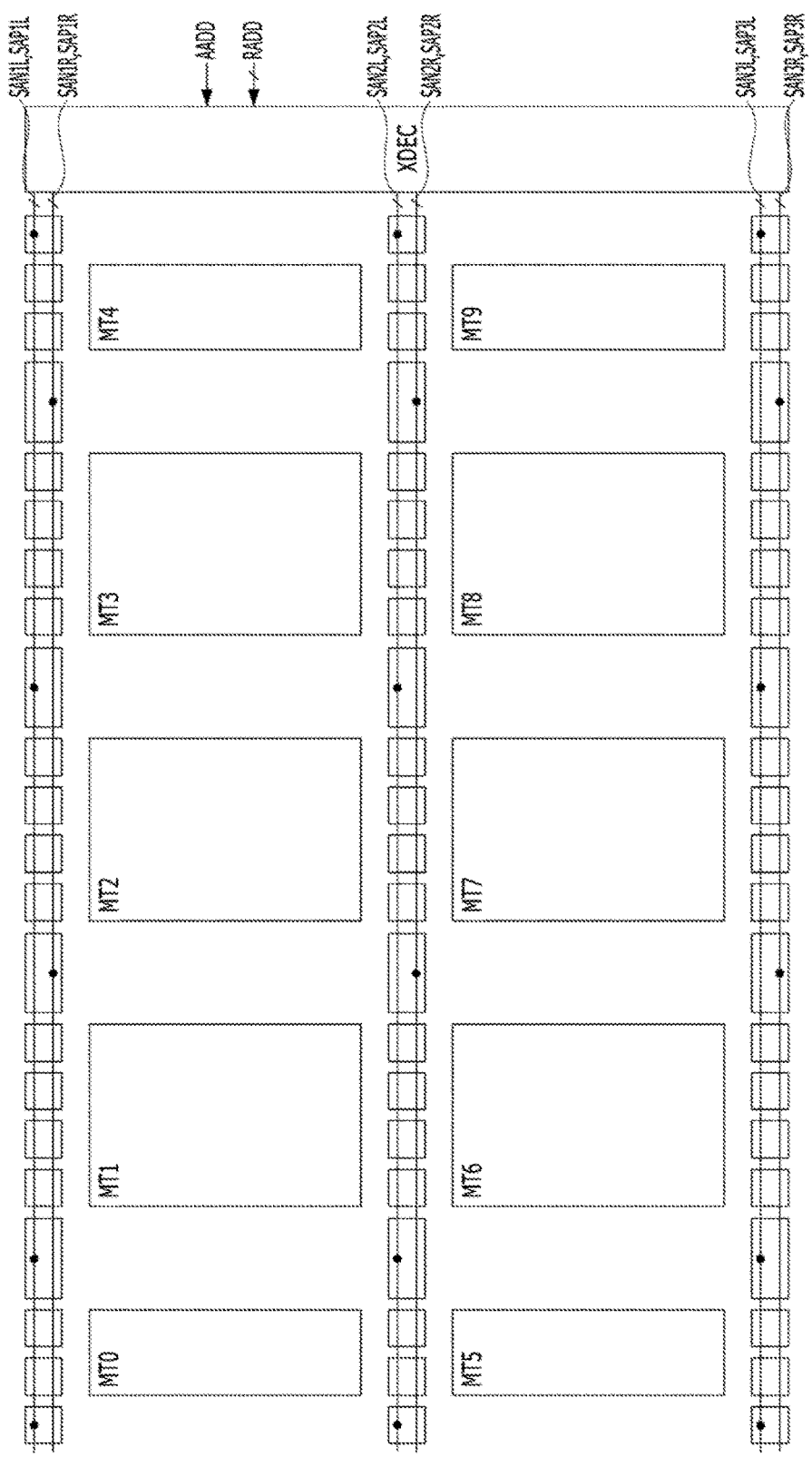
FIGS. 4A and 4B is a diagram illustrating signals which are used to control sense amplifiers in the memory device of FIG. 2.
Figure 4B:
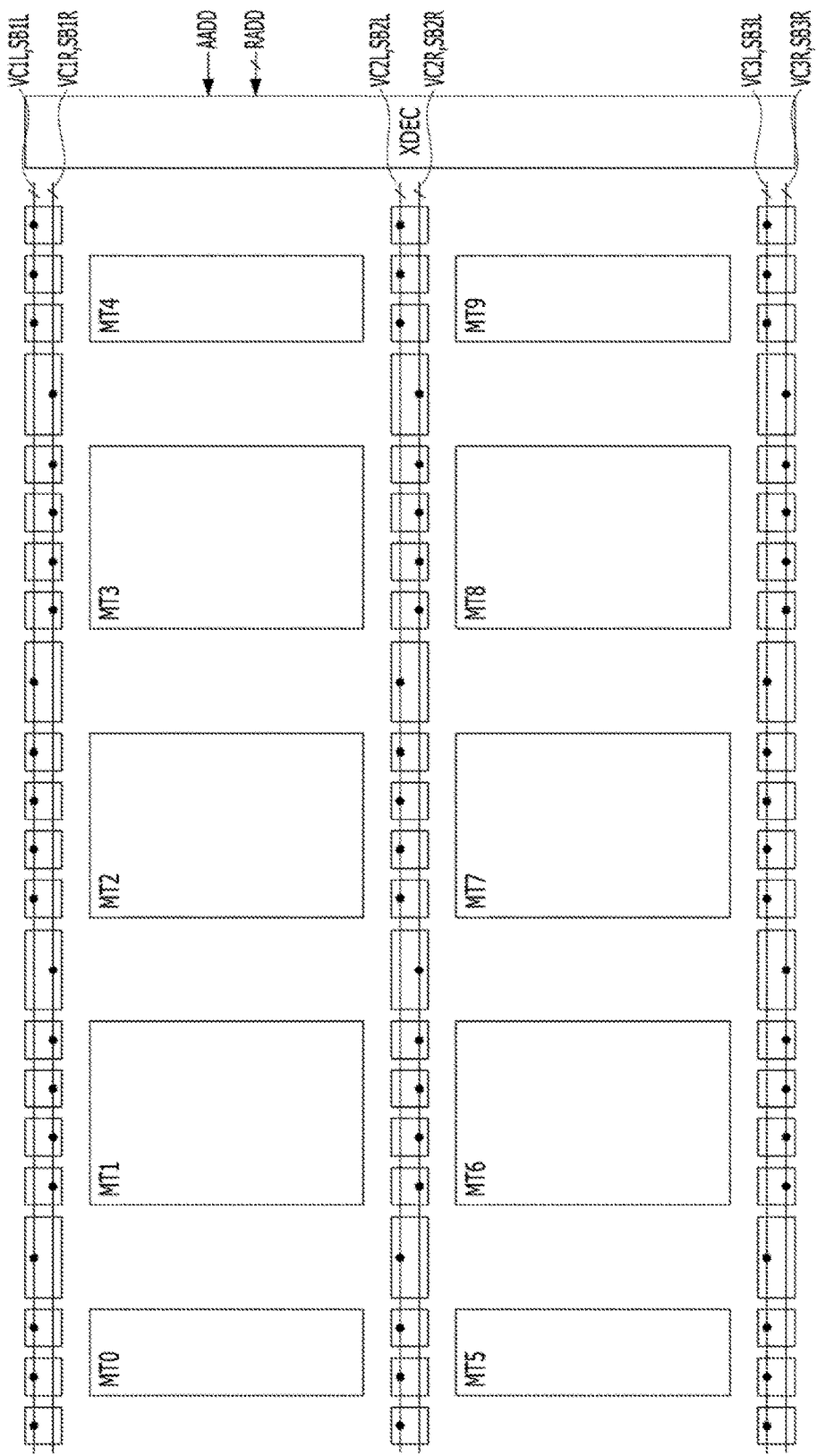
Figure 7:
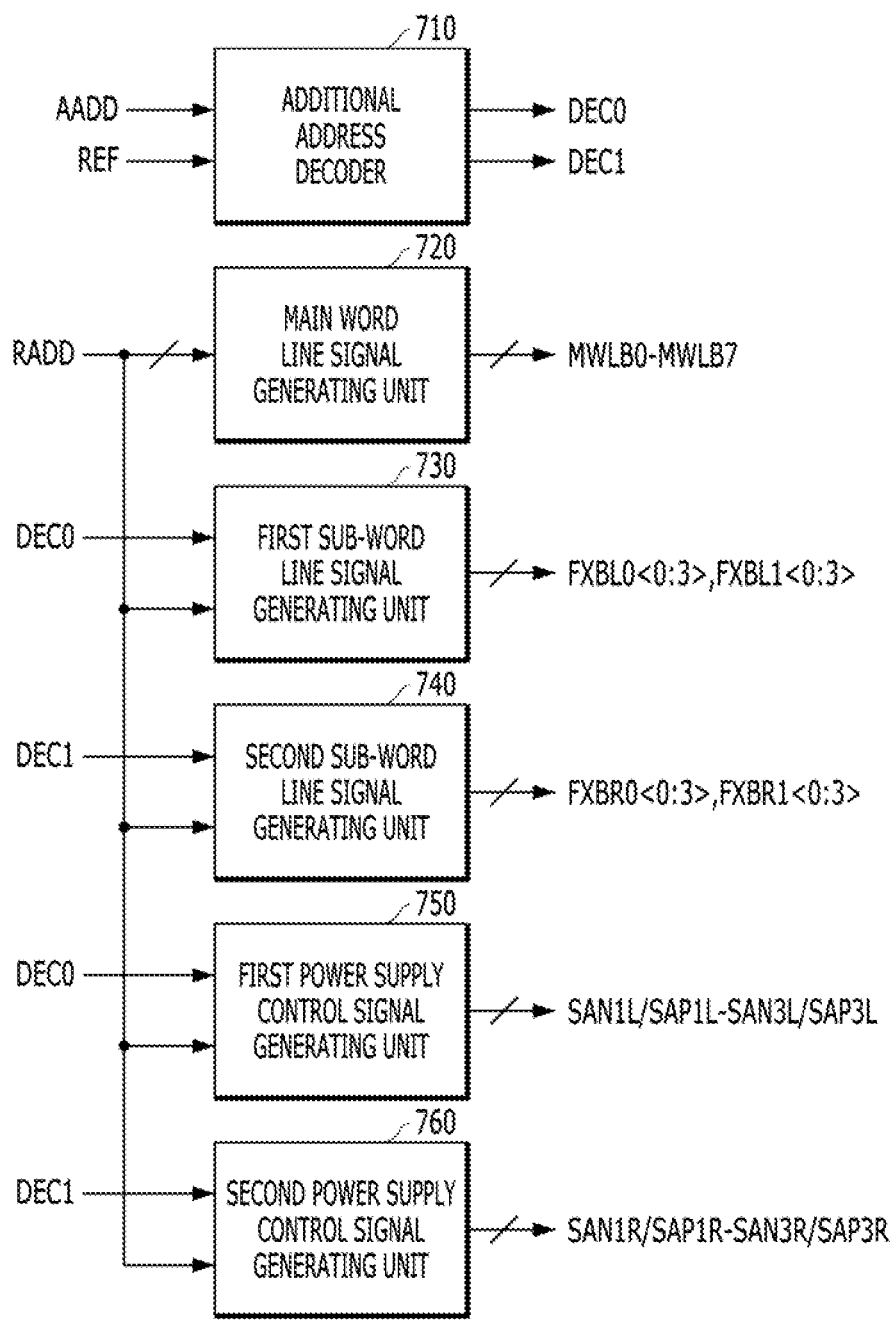
FIG. 7 is a configuration diagram of a row decoder.

FIG. 2 is a configuration diagram of a memory device in accordance with an exemplary embodiment of the present inventive concept. FIG. 3 is a diagram illustrating signals which are used to control sub-word lines among signals which are used in the memory device of FIG. 2. FIGS. 4A and 4B are diagrams illustrating signals which are used to control sensing amplifiers among signals which are used in the memory device of FIG. 2. FIG. 7 is a configuration diagram of a row decoder.

A group of which memory cells corresponds to the one main word line signal is called a page.

Referring to FIG. 2, the memory device may include a plurality of cell mats MT0 to MT9, a plurality of first drivers DL0 to DL9, a plurality of second drivers DR0 to DR9, a plurality of sense amplifiers SA, a row decoder XDEC, and a plurality of sub-hole circuits SH0 to SH17.

The plurality of cell mats MT0 to MT9 may be arranged in a plurality of rows and columns. Although, in FIG. 2, illustration has been made for the case where the plurality of cell mats MT0 to MT9 are arranged in two rows and five columns, the numbers of rows and columns in which the cell mats are arranged may be changed.

The plurality of cell mats MT0 to MT9 may include sub-word lines SWL0 to SWL3, bit lines BL0 to BL7 and memory cells MC. The plurality of cell mats MT0 to MT9 may be divided into the cell mats MT0, MT4, MT5 and MT9 (hereinafter, referred to as the outermost cell mats) which are disposed in the outermost columns, and the other cell mats MT1 to MT3 and MT6 to MT8 (hereinafter, referred to as the inner cell mats).

In an embodiment of the present inventive concept, each of the memory cells MC may include a dynamic random access memory cell which may include a transistor and a capacitor coupled to the transistor.

Each of the inner cell mats MT1 to MT3 and MT6 to MT8 may be divided into a first half mat (or left mat) LMT which is disposed on the left side of the inner cell mat, and a second half mat (or right mat) RMT which is disposed on the right side of the inner cell mat. Each of the outermost cell mats MT0, MT4, MT5 and MT9 may include only one of the first or second half mat LMT or RMT. In FIG. 2, for the sake of convenience in illustration, the illustration of the internal configurations of the cell mats MT2 to MT9 other than the cell mats MT0 and MT1 has been omitted.

Each of the plurality of first drivers DL0 to DL9 may be disposed on the left side of a corresponding one of the plurality of cell mats MT0 to MT9 and drive a first group of sub-word lines SWL0 and SWL2 of the corresponding cell mat. Each of the plurality of second drivers DR0 to DR9 may be disposed on the right side of a corresponding one of the plurality of cell mats MT0 to MT9 and drive a second group of sub-word lines SWL1 and SWL3 of the corresponding cell mat. The first group of sub-word lines SWL0 and SWL2 are the odd numbered sub-word lines, i.e., the first and third sub-word lines, whereas the second group of sub-word lines SWL1 and SWL3 are the even u=numbered sub-word lines, i.e., the second and fourth sub-word lines in the embodiment of FIG. 2.

Referring to FIGS. 2 and 3, each of the plurality of first and second drivers DL0 to DL9 and DR0 to DR9 may drive and activate a sub-word line corresponding to an activated main word line signal among a plurality of main word line signals MWLB0 to MWLB7 and an activated sub-word line signal among a plurality of sub-word line signals FXL0<0:3>/FXBL0<0:3>, FXR0<0:3>/FXBR0<0:3>, FXL1<0:3>/FXBL1<0:3> and FXR1<0:3>/FXBR1<0:3>.

Referring to FIG. 2, second drivers corresponding to cell mats in a $k_{th}$ (k is an odd number) column among a plurality of columns and first drivers corresponding to cell mats in a $k+1_{th}$ column may be disposed between the cell mats in the $k_{th}$ column and the cell mats in the $k+1_{th}$ column. For example, the second drivers DR0 and DR5 corresponding to the cell mats MT0 and MT5 in the first column and the first drivers DL1 and DL6 corresponding to the cell mats MT1 and MT6 in the second column may be disposed between the cell mats MT0 and MT5 in the first column and the cell mats MT1 and MT6 in the second column.

Referring to FIGS. 2 and 4B, each of the plurality of sense amplifiers SA may sense and amplify data of a corresponding bit line of a corresponding one of the plurality of cell mats. The sense amplifiers SA may transmit data between the bit lines and SIO (Segment Input/Output) line groups SG0 to SG11. Each SIO line group may include at least one SIO line. Each sense amplifier SA may perform sense and amplify operations when a corresponding pair of power supply voltage among pairs of power supply voltages VC1L/SB1L to VC3L/SB3L and VC1R/SB1R to VC3R/SB3R is enabled. The sense amplifiers SA may be disposed on opposite ends of the corresponding cell mats.

Referring to FIGS. 2 and 7, the row decoder XDEC may generate, during an active operation, a plurality of main word line signals MWLB0 to MWLB7 and a plurality of sub-word line signals FXBL0<0:3>, FXBR0<0:3>, FXBL1<0:3> and FXBR1<0:3>. The row decoder XDEC may enable a main word line signal corresponding to a row address RADD, and enable a sub-word line signal corresponding to an additional address AADD and the row address RADD.

The row decoder XDEC may generate power supply control signals SAN1L/SAP1L to SAN3L/SAP3L and SAN1R/SAP1R to SAN3R/SAP3R for controlling the sense amplifiers SA, and enable a power supply control signal corresponding to the additional address AADD and the row address RADD.

Table 1 illustrates enabling of the respective signals depending on values of the additional address AADD and values of the row address RADD. For reference, MWLB0 to MWLB7, FXBL0<0:3>, FXBR0<0:3>, FXBL1<0:3>, FXBR1<0:3>, SAP1L to SAP3L, and SAP1R to SAP3R may each be a signal which is enabled to a low level. SAN1L to SAN3L, and SAN1R to SAN3R each may be a signal which is enabled to a high level. Hereinafter, description will be made for the case where the additional address AADD is one bit, and the row address RADD is three bits.

TABLE 1

| AADD | RADD | MWLB | FXB | SAN | SAP |
|---|---|---|---|---|---|
| 0 | 000 | MWLB0 | FXBL0<0> | SAN1L SAN2L | SAP1L SAP2L |
| | 001 | MWLB1 | FXBL0<1> | SAN1L SAN2L | SAP1L SAP2L |
| | 010 | MWLB2 | FXBL0<2> | SAN1L SAN2L | SAP1L SAP2L |
| | 011 | MWLB3 | FXBL0<3> | SAN1L SAN2L | SAP1L SAP2L |
| | 100 | MWLB4 | FXBL1<0> | SAN2L SAN3L | SAP2L SAP3L |
| | 101 | MWLB5 | FXBL1<1> | SAN2L SAN3L | SAP2L SAP3L |
| | 110 | MWLB6 | FXBL1<2> | SAN2L SAN3L | SAP2L SAP3L |
| | 111 | MWLB7 | FXBL1<3> | SAN2L SAN3L | SAP2L SAP3L |
| 1 | 000 | MWLB0 | FXBL0<0> | SAN1R SAN2R | SAP1R SAP2R |
| | 001 | MWLB1 | FXBL0<1> | SAN1R SAN2R | SAP1R SAP2R |
| | 010 | MWLB2 | FXBL0<2> | SAN1R SAN2R | SAP1R SAP2R |
| | 011 | MWLB3 | FXBL0<3> | SAN1R SAN2R | SAP1R SAP2R |
| | 100 | MWLB4 | FXBL1<0> | SAN2R SAN3R | SAP2R SAP3R |
| | 101 | MWLB5 | FXBL1<1> | SAN2R SAN3R | SAP2R SAP3R |
| | 110 | MWLB6 | FXBL1<2> | SAN2R SAN3R | SAP2R SAP3R |
| | 111 | MWLB7 | FXBL1<3> | SAN2R SAN3R | SAP2R SAP3R |

The additional address AADD is an address for selecting either an odd-numbered column or an even-numbered column, and the row address RADD is an address for selecting a main word line signal.

Referring to FIGS. 2 to 4B, the plurality of sub-hole circuits SH0 to SH17 may generate a plurality of sub-word line signals FXL0<0:3>, FXR0<0:3>, FXL1<0:3> and FXR1<0:3> in response to a plurality of sub-word line signals FXBL0<0:3>, FXBR0<0:3>, FXBL1<0:3> and FXBR1<0:3>. The plurality of sub-hole circuits SH0 to SH17 may enable the pairs of power supply voltages VC1L/SB1L to VC3L/SB3L and VC1R/SB1R to VC3R/SB3R in response to the power supply control signals SAN1L to SAN3L and SAN1R to SAN3R.

Each local line group LG0 to LG4 may correspond to a plurality of the SIO line groups SG0 to SG11. Each line group LG0 to LG4 may include at least one local line. During a read or write operation, data may be transmitted between an SIO line group and a local line group which correspond to a selected cell mat. Although not shown in FIG. 2, switches may be coupled to circles A at which the SIO line groups SG0 to SG11 and the local line groups LG0 to LG4 intersect with each other.

The second half mats of cell mats in a $k_{th}$ (k is an odd number) column among the plurality of columns and the first half mats of cell mats in a $k+1_{th}$ column share a corresponding local line group meaning that they exchange data through the shared local line LG0 group.

For example, as illustrated in FIG. 2, the second half mats RMT of the cell mats MT0 and MT5 in the first column and the first half mats LMT of the cell mats MT1 and MT6 in the second column share the local line group LG0. In FIG. 2, illustration of the various signals which are which are used for operating the memory device of FIG. 2 has been purposefully omitted to avoid obfuscating the features of the memory device. The signals which are which are used for operating the memory device of FIG. 2 will be separately described and illustrated in FIGS. 3 and 4.

FIG. 3 is a diagram illustrating signals which are used to control the sub-word lines among the signals which are used in the memory device of FIG. 2.

Referring to FIG. 3, the row decoder XDEC may generate, during an active operation, a plurality of main word line signals MWLB0 to MWLB7 and a plurality of first sub-word line signals FXBL0<0:3>, FXBL1<0:3>, FXBR0<0:3> and FXBR1<0:3> in response to an additional address AADD and a row address RADD.

The sub-hole circuits SH0 to SH17 may generate a plurality of sub-word line signals FXL0<0:3>, FXL1<0:3>, FXR0<0:3> and FXR1<0:3> and enable a sub-word line corresponding to an enabled sub-word line signal among the plurality of second sub-word line signals FXL0<0:3>, FXL1<0:3>, FXR0<0:3> and FXR1<0:3> first sub-word line signals FXBL0<0:3>, FXBL1<0:3>, FXBR0<0:3> and FXBR1<0:3>. Each of the second sub-word line signals FXL0<0:3>, FXL1<0:3>, FXR0<0:3> and FXR1<0:3> may be a signal which is enabled to a high level.

Table 2 illustrates sub-word lines which are activated depending on the main word line signals and the first and second sub-word line signals.

TABLE 2

| MWLB | FX | FXB | SUB-WORD LINE |
|---|---|---|---|
| MWLB0 | FXL0<0> | FXBL0<0> | SWL0 OF MT0, MT2, MT4 |
| | FXR0<0> | FXBR0<0> | SWL0 OF MT1, MT3 |
| MWLB1 | FXL0<1> | FXBL0<1> | SWL1 OF MT0, MT2, MT4 |
| | FXR0<1> | FXBR0<1> | SWL1 OF MT1, MT3 |
| MWLB2 | FXL0<2> | FXBL0<2> | SWL2 OF MT0, MT2, MT4 |
| | FXR0<2> | FXBR0<2> | SWL2 OF MT1, MT3 |
| MWLB3 | FXL0<3> | FXBL0<3> | SWL3 OF MT0, MT2, MT4 |
| | FXR0<3> | FXBR0<3> | SWL3 OF MT1, MT3 |
| MWLB4 | FXL1<0> | FXBL1<0> | SWL0 OF MT5, MT7, MT9 |
| | FXR1<0> | FXBR1<0> | SWL0 OF MT6, MT8 |
| MWLB5 | FXL1<1> | FXBL1<1> | SWL1 OF MT5, MT7, MT9 |
| | FXR1<1> | FXBR1<1> | SWL1 OF MT6, MT8 |
| MWLB6 | FXL1<2> | FXBL1<2> | SWL2 OF MT5, MT7, MT9 |
| | FXR1<2> | FXBR1<2> | SWL2 OF MT6, MT8 |
| MWLB7 | FXL1<3> | FXBL1<3> | SWL3 OF MT5, MT7, MT9 |
| | FXR1<3> | FXBR1<3> | SWL3 OF MT6, MT8 |

In FIG. 3, for avoiding obfuscating the illustration, illustration of configurations unrelated to the operation of the sub-word lines has been omitted.

FIGS. 4A and 4B are diagrams illustrating signals which are used to control the sensing amplifiers (SA) in the memory device of FIG. 2.

Referring to FIG. 4A, during an active operation, the row decoder XDEC may generate power supply control signals SAN1L to SAN3L and SAN1R to SAN3R in response to an additional address AADD and a row address RADD.

Referring to FIG. 4B, the sub-hole circuits SH0 to SH17 may enable the pairs of power supply voltages VC1L/SB1L to VC3L/SB3L and VC1R/SB1R to VC3R/SB3R in response to the power supply control signals SAN1L to SAN3L and SAN1R to SAN3R. In this regard, VC1L/VC1R to VC3L/VC3R may be high-level voltages, and SB1L/SB1R to SB3L/SB3R may be low-level voltages.

Table 3 illustrates power supply voltages to be activated depending on the enabled power supply control signals.

TABLE 3

| SAN/SAP | PAIR OF POWER SUPPLY VOLTAGES |
| --- | --- |
| SAN1L/SAP1L | VC1L/SB1L |
| SAN1R/SAP1R | VC1R/SB1R |
| SAN2L/SAP2L | VC2L/SB2L |
| SAN2R/SAP2R | VC2R/SB2R |
| SAN3L/SAP3L | VC3L/SB3L |
| SAN3R/SAP3R | VC3R/SB3R |

In FIGS. 4A and 4B, for avoiding obfuscating the illustrations, configurations unrelated to the operation of the sense amplifiers have not been illustrated.

Figure 5A:
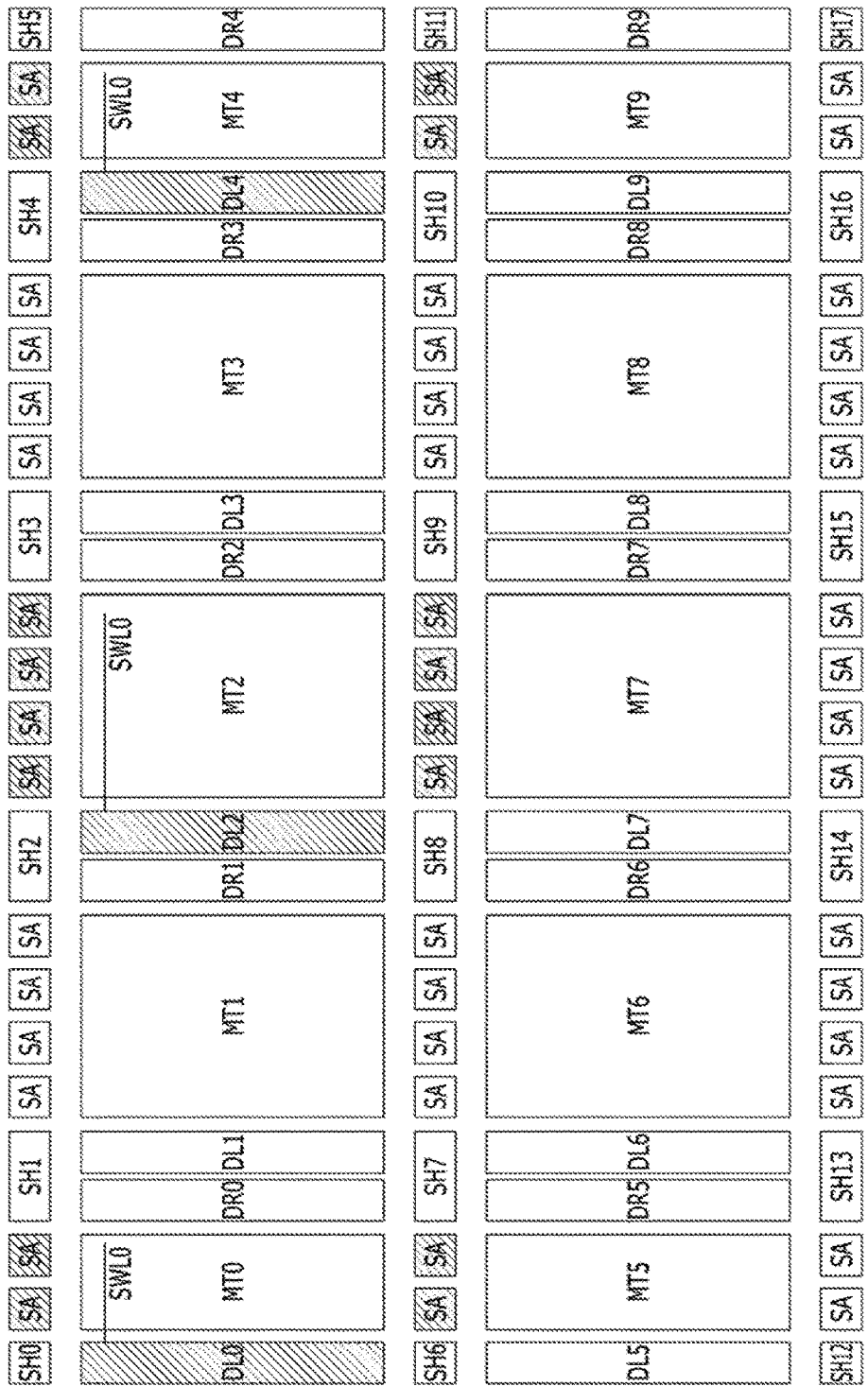
FIGS. 5A to 5C are diagrams illustrating an operation of activating sub-word lines in the memory device of FIG. 2.
Figure 5B:
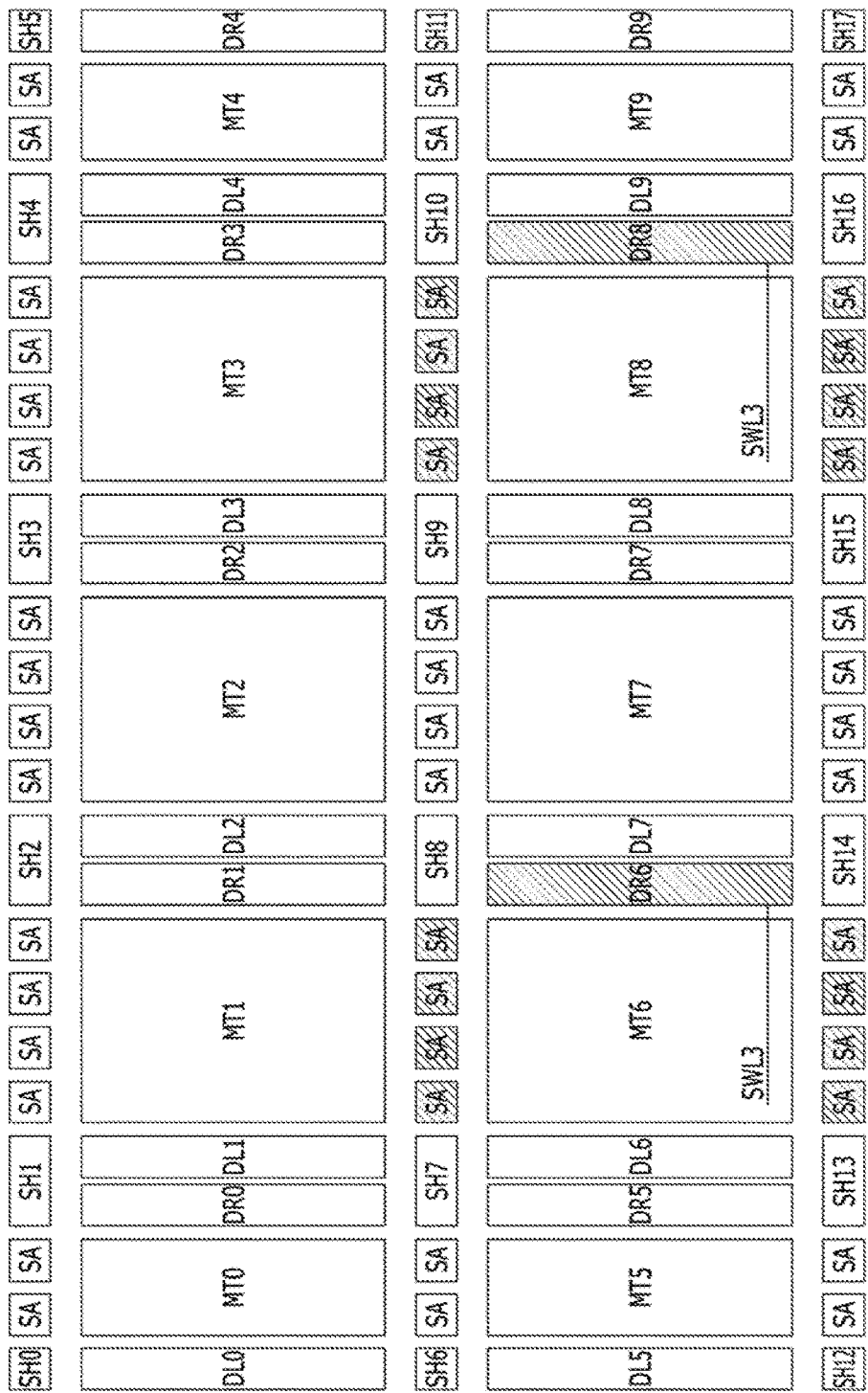
Figure 5C:
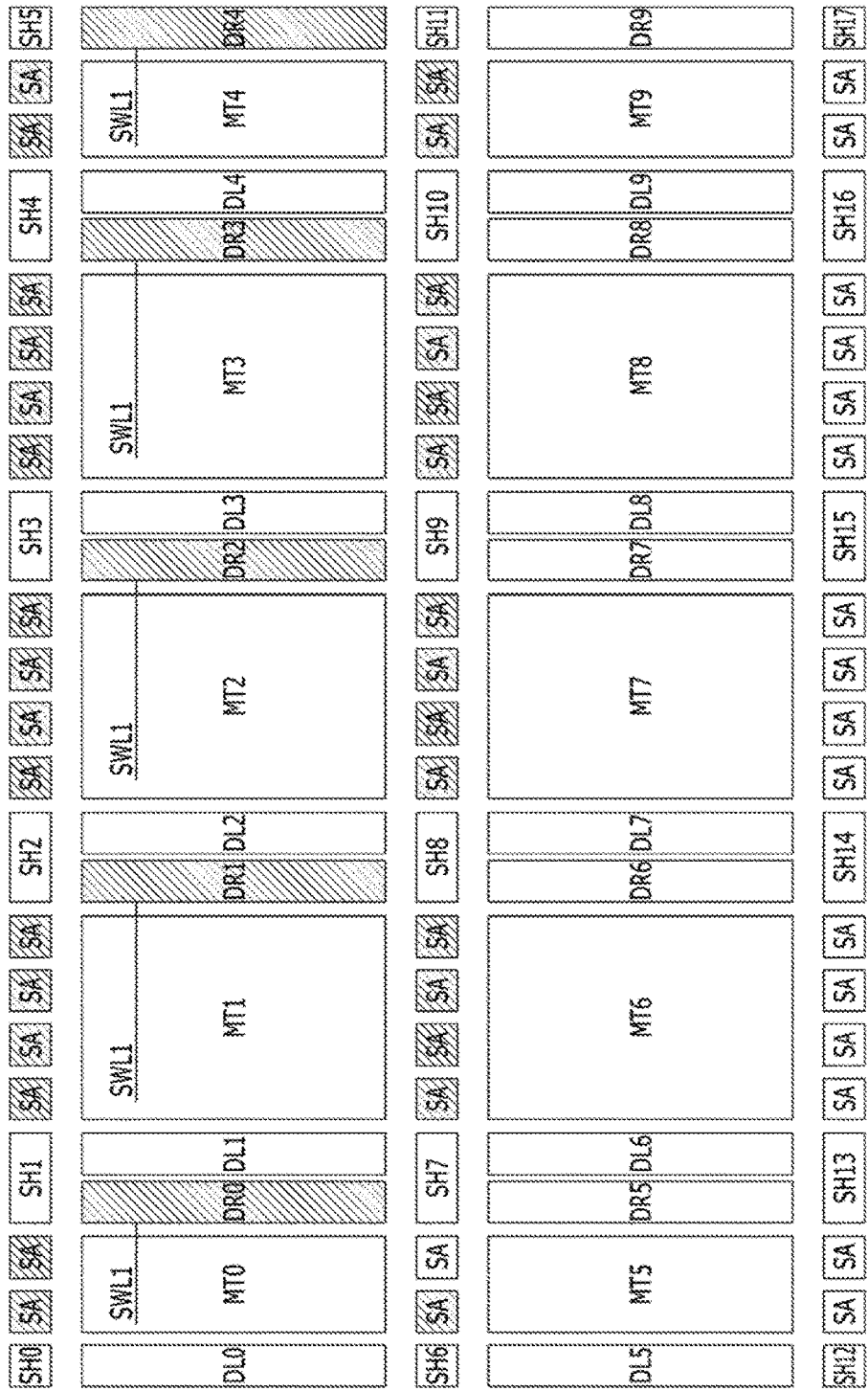

FIGS. 5A to 5C are diagrams illustrating an operation of activating a sub-word line in the memory device of FIG. 2.

During an active operation, the memory device may selectively activate, among the plurality of cell mats MT0 to MT9, at least one sub-word line of each cell mat disposed in the odd-numbered columns or at least one sub-word line of each cell mat disposed in the even-numbered columns. During an active operation, the memory device may selectively activate a sense amplifier corresponding to a cell mat including an activated sub-word line.

FIG. 5A illustrates the case where the sub-word lines SWL0 of the cell mats MT0, MT2 and MT4 disposed in the odd-numbered columns of the first row are activated.

If MWLB0, FXL0<0> and FXBL0<0> are enabled, the sub-word lines SWL0 of the cell mats MT0, MT2 and MT4 may be activated by the drivers DL0, DL2 and DL4. If SAN1L/SAP1L and SAN2L/SAP2L are enabled, the sense amplifiers SA corresponding to the cell mats MT0, MT2 and MT4 may be enabled. The enabled drivers DL0, DL2 and DL4 and sense amplifiers SA are represented by the hatched areas. In FIG. 5A, only the activated sub-word lines are illustrated.

FIG. 5B illustrates the case where the sub-word lines SWL3 of the cell mats MT6 and MT8 disposed in the even-numbered columns are activated.

If MWLB7, FXR1<3> and FXBR1<3> are enabled, the sub-word lines SWL3 of the cell mats MT6 and MT8 may be activated by the drivers DR6 and DR8. If SAN2R/SAP2R and SAN3R/SAP3R are enabled, the sense amplifiers SA corresponding to the cell mats MT6 and MT8 may be enabled. The enabled drivers DR6 and DR8 and sense amplifiers SA are represented by the hatched areas. In FIG. 5B, only the activated sub-word lines are illustrated.

As such, the memory device of FIG. 2 may selectively activate the sub-word lines and also selectively enable the sense amplifiers, whereby current consumption during the active operation can be reduced despite allowing an increase in size of a page.

FIG. 5C illustrates the case where the sub-word lines SWL1 of the cell mats MT0 and MT4 disposed in the odd and even-numbered columns are activated during a refresh operation.

If MWLB1, FXL0<1>, FXR0<1>, FXBL0<1> and FXBR0<1> are enabled, the sub-word lines SWL1 of the cell mats MT0 to MT4 may be activated by the drivers DR0 to DR4. If SAN1L/SAP1L, SAN1R/SAP1R, SAN2L/SAP2L and SAN2R/SAP2R are enabled, the sense amplifiers SA corresponding to the cell mats MT0 to MT4 may be enabled. The enabled drivers DR0 to DR4 and sense amplifiers SA are represented by the hatched areas. In FIG. 5C, only the activated sub-word lines are illustrated.

Figure 6A:
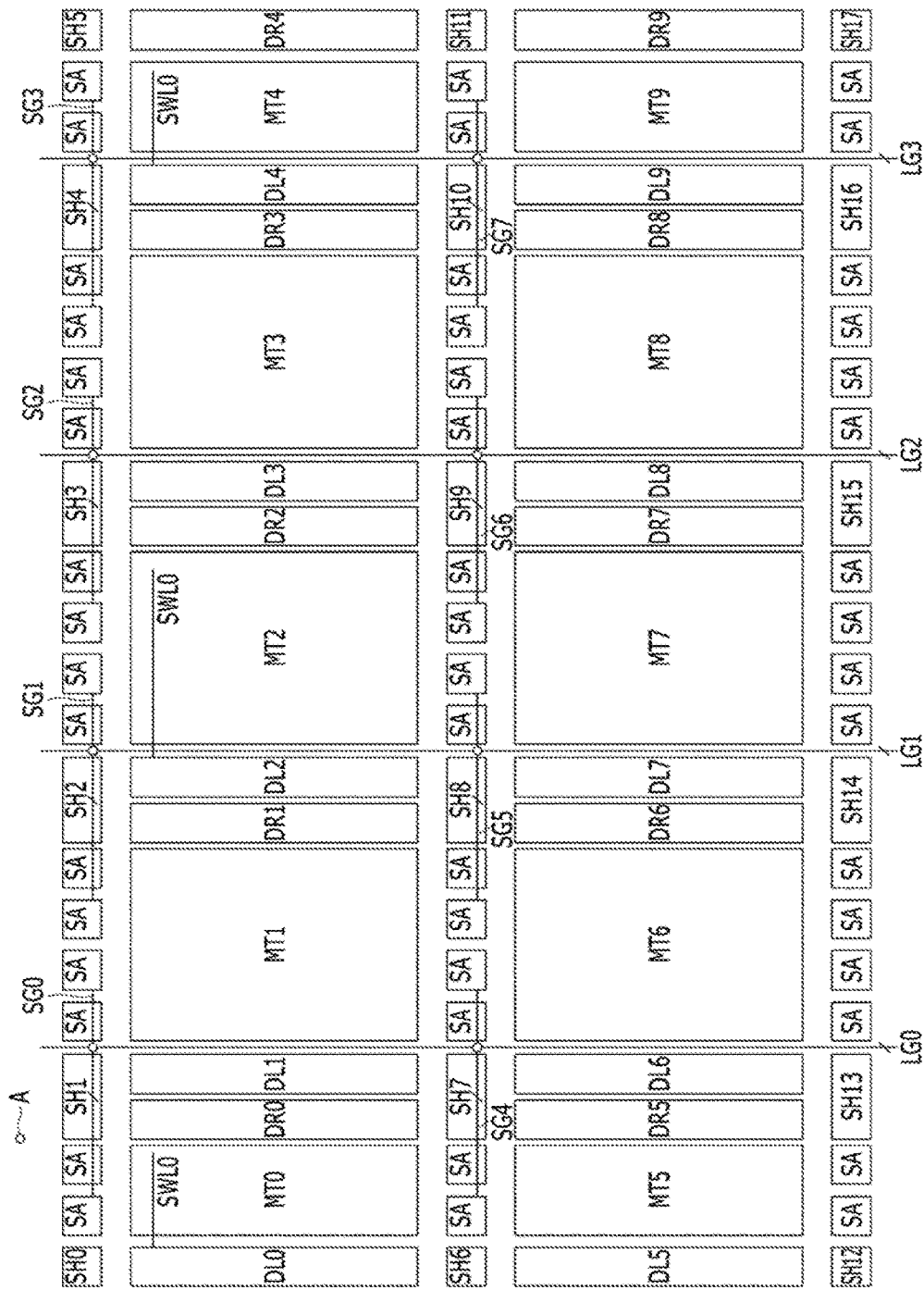
FIGS. 6A and 6B are diagrams illustrating a read or write operation in the memory device of FIG. 2.
Figure 6B:
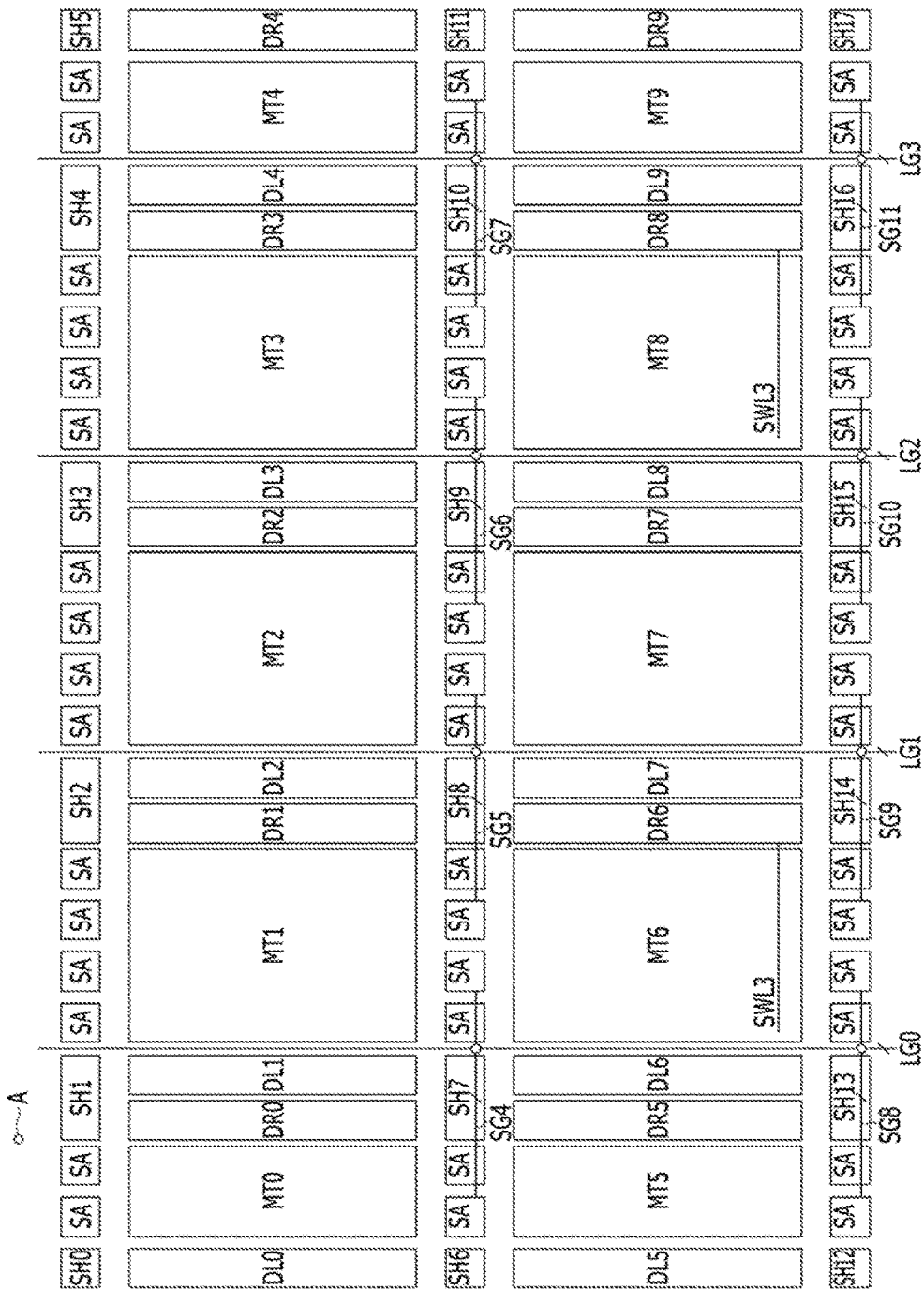

FIGS. 6A and 6B are diagrams illustrating a read or write operation in the memory device of FIG. 2. FIGS. 6A and 6B illustrate only line groups through which data is actually transmitted.

FIG. 6A illustrates the case where a read or write operation for the cell mats MT0, MT2 and MT4 disposed in the odd-numbered columns is performed.

As in the case shown in FIG. 5A, after the sub-word lines SWL0 of the cell mats MT0, MT2 and MT4 disposed in the odd-numbered columns are activated, the cell mats MT0, MT2 and MT4 to be read or written are selected. Data to be written on the cell mat MT0 or data read from the cell mat MT0 is transmitted through the SIO line groups SG0 and SG4 and the local line group LG0. Data to be written on the half mat LMT of the cell mat MT2 or data read from the half mat LMT of the cell mat MT2 is transmitted through the SIO line groups SG1 and SG5 and the local line group LG1. Data to be written on the half mat RMT of the cell mat MT2 or data read from the half mat RMT of the cell mat MT2 is transmitted through the SIO line groups SG2 and SG6 and the local line group LG2. Data to be written on the cell mat MT4 or data read from the cell mat MT4 is transmitted through the SIO line groups SG3 and SG7 and the local line group LG3.

FIG. 6B illustrates the case where a read or write operation for the cell mats MT6 and MT8 disposed in the even-numbered columns is performed.

As in the case shown in FIG. 5B, after the sub-word lines SWL3 of the cell mats MT6 and MT8 disposed in the even-numbered columns are activated, the cell mats MT6 and MT8 to be read or written are selected. Data to be written on the half mat LMT of the cell mat MT6 or data read from the half mat LMT of the cell mat MT6 is transmitted through the SIO line groups SG4 and SG8 and the local line group LG0. Data to be written on the half mat RMT of the cell mat MT6 or data read from the half mat RMT of the cell mat MT6 is transmitted through the SIO line groups SG5 and SG9 and the local line group LG1. Data to be written on the half mat LMT of the cell mat MT8 or data read from the half mat LMT of the cell mat MT8 is transmitted through the SIO line groups SG6 and SG10 and the local line group LG2. Data to be written on the half mat RMT of the cell mat MT8 or data read from the half mat RMT of the cell mat MT8 is transmitted through the SIO line groups SG7 and SG11 and the local line group LG3.

FIG. 7 is a configuration diagram of the row decoder (XDEC), according to an embodiment of the present invention.

Referring to FIG. 7, the row decoder XDEC may include an additional address decoder 710, a main word line signal generating unit 720, first and second sub-word line signal generating units 730 and 740, and first and second power supply control signal generating units 750 and 760.

The additional address decoder 710 may enable a first decoding signal DEC0 when the value of the additional address AADD is '0', and enable a second decoding signal DEC1 when the value of the additional address AADD is '1'. The additional address decoder 710 may enable, when a signal REF indicating a refresh operation is enabled, the first and second decoding signals DEC0 and DEC1 regardless of the value of the additional address AADD.

The main word line signal generating unit 720 may enable, among the plurality of main word line signals MWLB0 to MWLB7, a main word line signal corresponding to the row address RADD.

The first sub-word line signal generating unit 730 may enable, when the first decoding signal DEC0 is enabled, a sub-word line signal corresponding to the row address RADD among the plurality of sub-word line signals FXBL0<0:3> and FXBL1<0:3>.

The second sub-word line signal generating unit 740 may enable, when the second decoding signal DEC1 is enabled, a sub-word line signal corresponding to the row address RADD among the plurality of sub-word line signals FXBR0<0:3> and FXBR1<0:3>.

The first power supply control signal generating unit 750 may enable, when the first decoding signal DEC0 is enabled, power supply control signals corresponding to the row address RADD among the power supply control signals SAN1L/SAP1L to SAN3L/SAP3L.

The second power supply control signal generating unit 760 may enable, when the second decoding signal DEC1 is enabled, power supply control signals corresponding to the row address RADD among the power supply control signals SAN1R/SAP1R to SAN3R/SAP3R.

Figure 8:
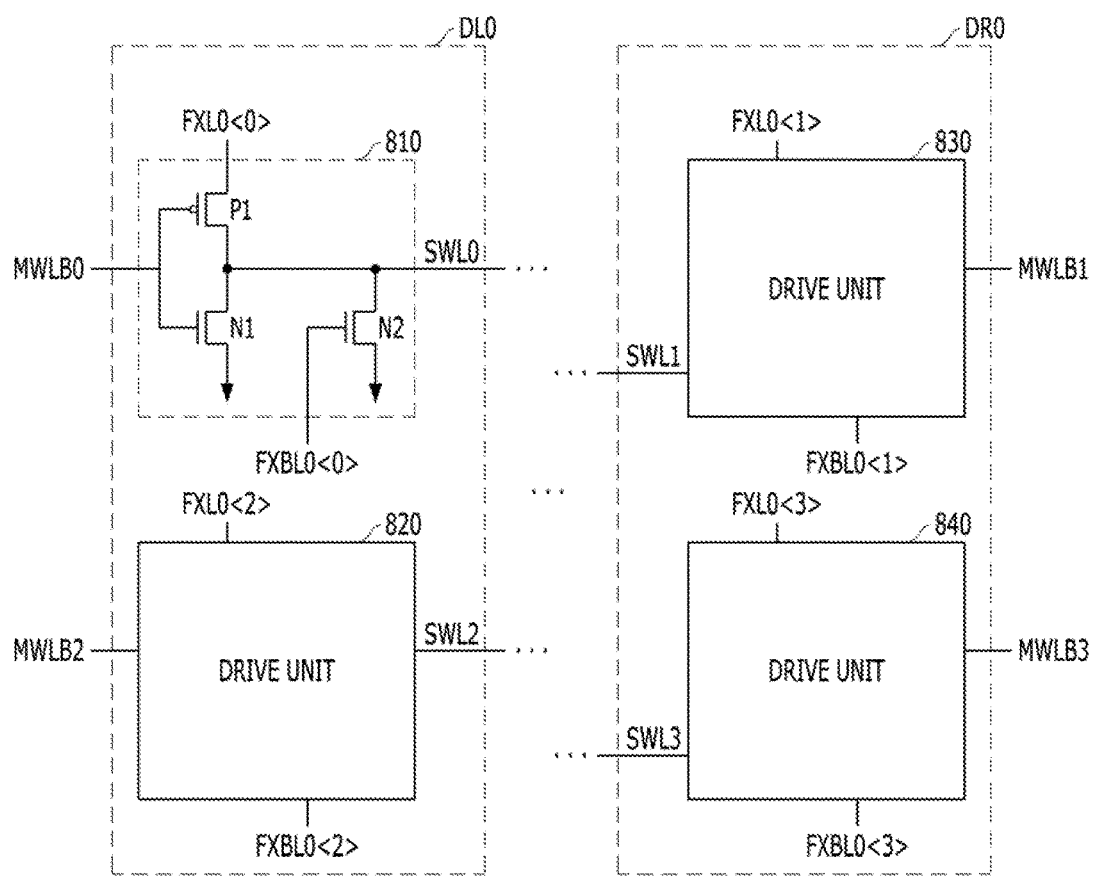
FIG. 8 is a configuration diagram of drivers.

FIG. 8 is a configuration diagram of the drivers DL0 and DR0, according to an embodiment of the present invention.

Referring to FIG. 8, the driver DL0 may include drive units 810 and 820, and the driver DR0 may include drive units 830 and 840.

The drive unit 810 may drive the sub-word line SWL0 in response to the sub-word line signals FXL0<0> and FXBL0<0> and the main word line signal MWLB0. The drive unit 810 may drive the sub-word line SWL0 at a low-level voltage when the sub-word line signals FXL0<0> and FXBL0<0> and the main word line signal MWLB0 are disabled. The drive unit 810 may drive the sub-word line SWL0 at a high-level voltage when the sub-word line signals FXL0<0> and FXBL0<0> and the main word line signal MWLB0 are enabled. For the foregoing operations, the drive unit 810 may include NMOS transistors N1 and N2 and PMOS transistors P1.

Each of the other drive units 820, 830 and 840 may drive a corresponding sub-word line in response to a corresponding sub-word line signal and a corresponding main word line signal. Furthermore, each of the drive units 820, 830 and 840 may have the same configuration as that of the drive unit 810.

The drivers DL1 to DL9 and DR1 to DR9 may have the same configurations as those of the drivers DL0 and DL1 shown in FIG. 8 and be operated in the same manner as those of the drivers DL0 and DL1.

Figure 9:
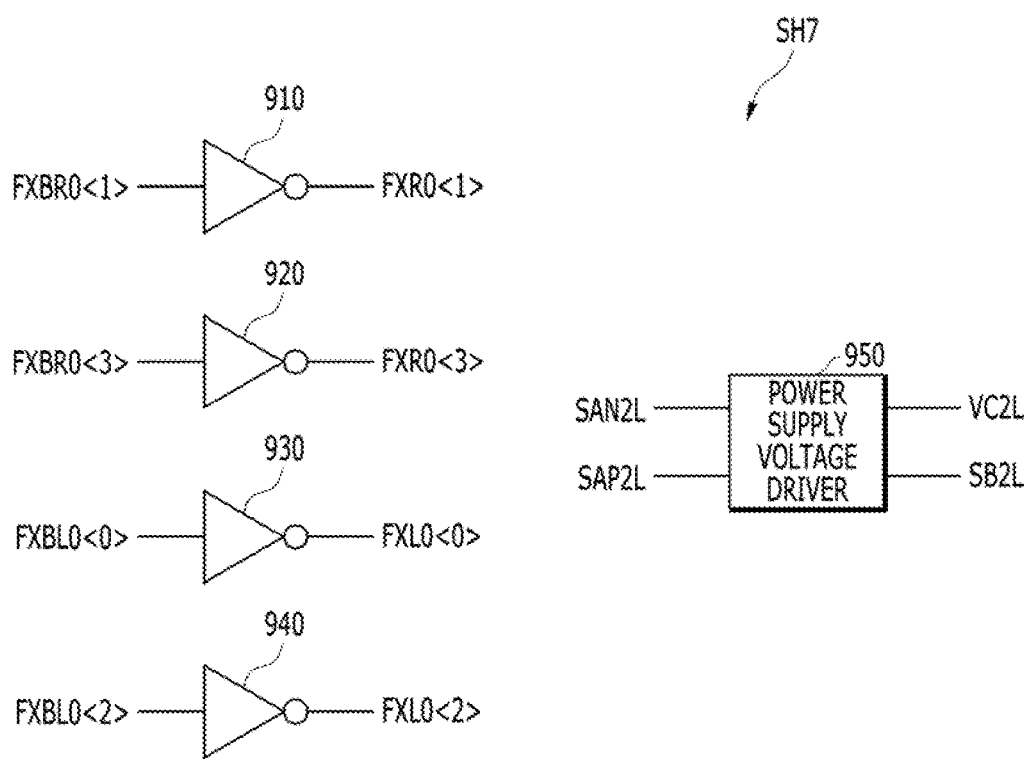
FIG. 9 is a configuration diagram of a sub-hole circuit.

FIG. 9 is a configuration diagram of the sub-hole circuit SH7, according to an embodiment of the present invention.

Referring to FIG. 9, the sub-hole circuit SH7 may include a plurality of repeaters 910 to 940 and a power supply voltage driver 950.

The plurality of repeaters 910 to 940 may respectively invert corresponding sub-word line signals FXRB0<1>, FXRB0<3>, FXLB0<0>, and FXLB0<2> and thus respectively generate sub-word line signals FXR0<1>, FXR0<3>, FXL0<0> and FXL0<2>.

The power supply voltage driver 950 may enable, in response to power supply control signals SAN2L and SAP2L, a pair of power supply voltages VC2L and SB2L to a high-level voltage and a low-level voltage, respectively.

The other sub-hole circuits SH0 to SH6 and SH8 to SH17 may have the same configuration as that of the sub-hole circuit SH7, or have only some configurations of the sub-hole circuit SH7.

Figure 10:
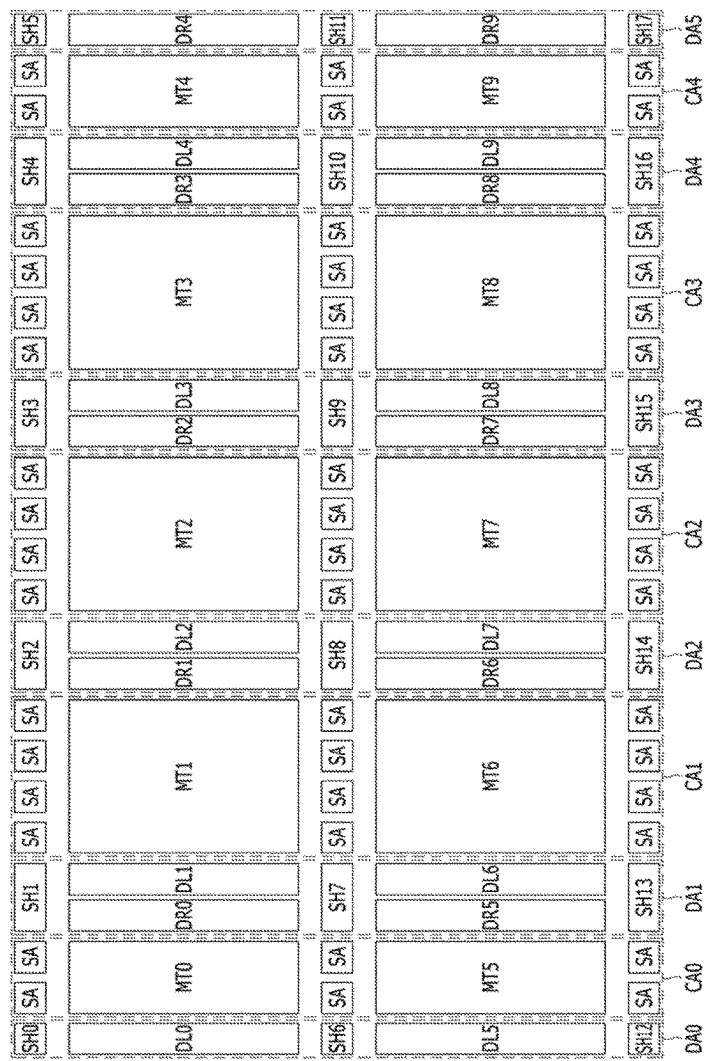
FIG. 10 is a configuration diagram of a memory device in accordance with an embodiment of the present invention.

FIG. 10 is a configuration diagram of a memory device in accordance with an embodiment of the present invention.

Referring to FIG. 10, the memory device may include a plurality of cell areas CA0 to CA4, first and second outer driver areas DA0 and DA5, and one or more inner driver areas DA1 to DA4.

Each of the cell areas CA0 to CA4 may include some of the plurality of cell mats MT0 to MT9. More specifically, cell area CA0 includes cell mats MT0 and MT5, cell area CA1 includes cell mats MT1 and MT6, cell area CA2 includes cell mats MT3 and MT8, and cell area CA4 includes cell mats MT4 and MT9. Each of the cell mats MT0 to MT9 may include a plurality of sub-word lines, a plurality of bit lines and a plurality of memory cells. The cell mats that are included in each of the cell areas CA0 to CA4 may be disposed in one column, and the cell areas CA0 to CA4 may be arranged in one row. Each of the inner cell mats MT1 to MT3 and MT6 to MT8 may be divided into a first half mat LMT which is disposed on the left side, and a second half mat RMT which is disposed on the right side. Each of the outer cell mats MT0, MT4, MT5 and MT9 may include only either a first or a second half mat LMT or RMT.

The first and second outer driver areas DA0 and DA5 may be respectively disposed outside the cell area CA0 and the cell area CA4, and each may include the drivers DL0 and DL5 or DR4 and DR9 that are arranged in one column.

Each of the inner driver areas DA1 to DA4 is disposed between two consecutive cell areas among the cell areas CA0 to CA4. Specifically, inner driver area DA1 is positioned between cell areas CA0 and CA1, inner driver area DA2 is positioned between cell areas CA1 and CA2, inner driver area DA3 is positioned between CA2 and CA3, and inner driver area DA4 is positioned between cell areas CA3 and CA4. Each of the inner driver areas DA1 to DA4 includes a plurality of first and second drivers among the drivers DL1 to DL4, DL6 to DL9, DR0 to DR4, and DR5 to DR8 that are arranged in two columns, a first column of first drivers and a second column of second drivers. Specifically, inner driver area DA1 includes a first column of first drivers DL1 and DL6 and a second column of second drivers DR0 and DR5, inner driver area DA2 includes a first column of first drivers DL2 and DL7 and a second column of second drivers DR1 and DR6, inner driver area DA3 includes a first column of first drivers DL3 and DL8 and a second column of second drivers DR2 and DR7, and inner driver area DA4 includes a first column of first drivers DL4 and DL9 and a second column of second drivers DR3 and DR8.

Each of the first and second drivers DL0 to DL9 and DR0 to DR9 may drive a sub-word line of an adjacent one of the cell mats MT0 to MT9. During an active operation, the memory device may select, among the cell areas CA0 to CA4, a cell area disposed in the odd-numbered cell areas CA0, CA2 and CA4 or the even-numbered cell areas CA1 and CA3, and activate a sub-word line included in a cell mat of the selected cell area.

The configuration and detailed operation of the memory device of FIG. 10 are the same as those of the memory device of FIG. 2.

Therefore, according to various embodiments of the present invention a memory device is provided having a plurality of memory cells organized in pages wherein the size of each page is designed to be large, and current consumption during an active operation of a memory device can be reduced by making it possible to selectively activate a sub-word line among a plurality of sub-word lines in a page.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
a plurality of cell areas each including a plurality of cell mats arranged in one column;
one or more inner driver areas, which are disposed between the plurality of cell areas in an alternating manner, each of the one or more inner driver areas including a first plurality of drivers arranged in two columns; and
first and second outer driver areas, which are disposed outside the plurality of cell areas, and each of which includes a second plurality of drivers arranged in one column,
wherein each of the first and second plurality of drivers drives a sub-word line of a cell mat adjacent thereto, and, during an active operation, sub-word lines of cell mats disposed in odd-numbered cell areas or sub-word lines of cell mats disposed in even-numbered cell areas among the plurality of cell areas are selectively activated.

2. The memory device of claim 1,
wherein each of the cell mats is divided into a first half mat disposed on a left side, and a second half mat disposed on a right side, and
wherein the first half mat and the second half mat that are adjacent to the same inner driver area among the plurality of inner driver areas share one or more local lines.

3. The memory device of claim 2, wherein each of cell mats in a left outermost column among the plurality of cell areas includes only any one half mat of the first half mat and the second half mat.

4. The memory device of claim 1,
wherein the sub-word lines are divided into first and second groups, and
wherein a driver disposed on a left side of a cell mat drives a first group of sub-word lines, and a driver disposed on a right side of the cell mat drives a second group of sub-word lines.

5. The memory device of claim 1, further comprising:
a plurality of sense amplifiers, each of which is configured to drive a bit line of a corresponding cell mat of the plurality of cell mats.

6. The memory device of claim 5, wherein, during the active operation, among the plurality of sense amplifiers, sense amplifiers corresponding to the cell mats including the activated sub-word lines are selectively enabled.

7. The memory device of claim 1, wherein, during the active operation, one side of the odd-numbered cell areas and the even-numbered cell areas is selected in response to an additional address.

8. The memory device of claim 7, wherein, during a read or write operation, one side of the odd-numbered cell areas and the even-numbered cell areas is selected in response to the additional address.

* * * * *